United States Patent
Kubota

(10) Patent No.: US 10,777,424 B2
(45) Date of Patent: Sep. 15, 2020

(54) METHOD FOR MANUFACTURING SEMICONDUCTOR DEVICE

(71) Applicants: Kabushiki Kaisha Toshiba, Minato-lu, Tokyo (JP); Toshiba Electronic Devices & Storage Corporation, Minato-ku, Tokyo (JP)

(72) Inventor: Takeo Kubota, Nomi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/286,815

(22) Filed: Feb. 27, 2019

(65) Prior Publication Data

US 2019/0267247 A1    Aug. 29, 2019

(30) Foreign Application Priority Data

Feb. 27, 2018   (JP) ................................ 2018-033541
Sep. 18, 2018   (JP) ................................ 2018-173333

(51) Int. Cl.
    *H01L 21/321*      (2006.01)
    *H01L 21/306*      (2006.01)
    (Continued)

(52) U.S. Cl.
    CPC .... *H01L 21/3212* (2013.01); *H01L 21/02002* (2013.01); *H01L 21/02005* (2013.01);
    (Continued)

(58) Field of Classification Search
CPC ......... H01L 21/02002; H01L 21/02005; H01L 21/02008; H01L 21/02021;
(Continued)

(56) References Cited

U.S. PATENT DOCUMENTS 6,268,090 B1 *  7/2001  Matsubara .......... H01L 21/7684
                                                                257/E21.304
6,797,625 B2    9/2004   Kim et al.
(Continued)

FOREIGN PATENT DOCUMENTS

JP      H09-293698 A    11/1997
JP      3161425 B2       4/2001
(Continued)

*Primary Examiner* — Eduardo A Rodela
(74) *Attorney, Agent, or Firm* — White & Case LLP

(57) ABSTRACT

According to one embodiment, a method for manufacturing a semiconductor device is disclosed. The method can include forming a second layer covering a first layer on a first region of a semiconductor substrate. The semiconductor substrate includes the first region and a second region. The first layer covers the second region and a portion of the first region. First openings are formed. The method can include removing the first layer on the second region using the second layer as a mask. The method can include forming an impurity region including an n-type impurity in the second region. The method can include removing the second layer, and growing silicon layers inside the first openings and on the second region. In addition, the method can include polishing a portion of each of the silicon layers using the first layer as a stopper.

12 Claims, 6 Drawing Sheets

(51) Int. Cl.

| | | |
|---|---|---|
| *H01L 29/78* | (2006.01) | |
| *H01L 29/06* | (2006.01) | |
| *H01L 29/10* | (2006.01) | |
| *H01L 29/167* | (2006.01) | |
| *H01L 29/66* | (2006.01) | |
| *H01L 21/265* | (2006.01) | |
| *H01L 21/266* | (2006.01) | |
| *H01L 21/225* | (2006.01) | |
| *H01L 21/324* | (2006.01) | |
| *H01L 21/02* | (2006.01) | |
| *H01L 27/11526* | (2017.01) | |
| *H01L 21/304* | (2006.01) | |
| *H01L 21/302* | (2006.01) | |
| *H01L 27/11512* | (2017.01) | |
| *H01L 27/11509* | (2017.01) | |
| *H01L 27/108* | (2006.01) | |
| *H01L 27/11* | (2006.01) | |

(52) U.S. Cl.
CPC .. *H01L 21/02008* (2013.01); *H01L 21/02021* (2013.01); *H01L 21/02532* (2013.01); *H01L 21/2253* (2013.01); *H01L 21/266* (2013.01); *H01L 21/26513* (2013.01); *H01L 21/302* (2013.01); *H01L 21/304* (2013.01); *H01L 21/3043* (2013.01); *H01L 21/30625* (2013.01); *H01L 21/324* (2013.01); *H01L 27/10897* (2013.01); *H01L 27/1116* (2013.01); *H01L 27/11509* (2013.01); *H01L 27/11512* (2013.01); *H01L 27/11526* (2013.01); *H01L 29/063* (2013.01); *H01L 29/1095* (2013.01); *H01L 29/167* (2013.01); *H01L 29/66734* (2013.01); *H01L 29/7813* (2013.01)

(58) Field of Classification Search
CPC ............. H01L 21/02024; H01L 21/302; H01L 21/304; H01L 21/3043; H01L 21/30625; H01L 21/3212; H01L 21/03602; H01L 21/03616; H01L 27/10897; H01L 27/1116; H01L 27/11286; H01L 27/11509; H01L 27/11512; H01L 27/11526

See application file for complete search history.

(56) References Cited

U.S. PATENT DOCUMENTS

| | | | |
|---|---|---|---|
| 8,237,227 B2 * | 8/2012 | Lai | H01L 21/31053 257/368 |
| 2002/0034848 A1 * | 3/2002 | Park | H01L 27/10894 438/239 |
| 2006/0223278 A1 * | 10/2006 | Kim | H01L 27/1052 438/424 |
| 2007/0049032 A1 * | 3/2007 | Abatchev | H01L 21/0337 438/691 |
| 2008/0003830 A1 * | 1/2008 | Qing | H01L 21/31144 438/694 |
| 2009/0004864 A1 * | 1/2009 | Kim | H01L 21/3212 438/693 |
| 2012/0149185 A1 * | 6/2012 | Kim | H01L 27/11582 438/589 |
| 2014/0239454 A1 * | 8/2014 | Cai | H01L 21/02002 257/619 |
| 2014/0273480 A1 * | 9/2014 | Previtali | H01L 21/31105 438/703 |
| 2015/0333153 A1 * | 11/2015 | Eguchi | H01L 23/544 438/270 |
| 2016/0027660 A1 | 1/2016 | Matsui et al. | |
| 2017/0301557 A1 * | 10/2017 | Chi | H01L 21/31144 |
| 2017/0352541 A1 * | 12/2017 | Hsu | H01L 21/02636 |

FOREIGN PATENT DOCUMENTS

| | | |
|---|---|---|
| JP | 4163494 B2 | 10/2008 |
| JP | 6196589 B2 | 9/2017 |

* cited by examiner

_US 10,777,424 B2_

METHOD FOR MANUFACTURING SEMICONDUCTOR DEVICE

CROSS-REFERENCE TO RELATED APPLICATIONS

This application is based upon and claims the benefit of priority from Japanese Patent Application No. 2018-033541, filed on Feb. 27, 2018; and Japanese Patent Application No. 2018-173333 filed on Sep. 18, 2018; the entire contents of which are incorporated herein by reference.

FIELD

Embodiments described herein relate generally to a method for manufacturing a semiconductor device.

BACKGROUND

A method for manufacturing a semiconductor device includes growing silicon on a semiconductor substrate and polishing the silicon. A yield is favorable to be high in the method for manufacturing the semiconductor device.

DETAILED DESCRIPTION

Figure 1:
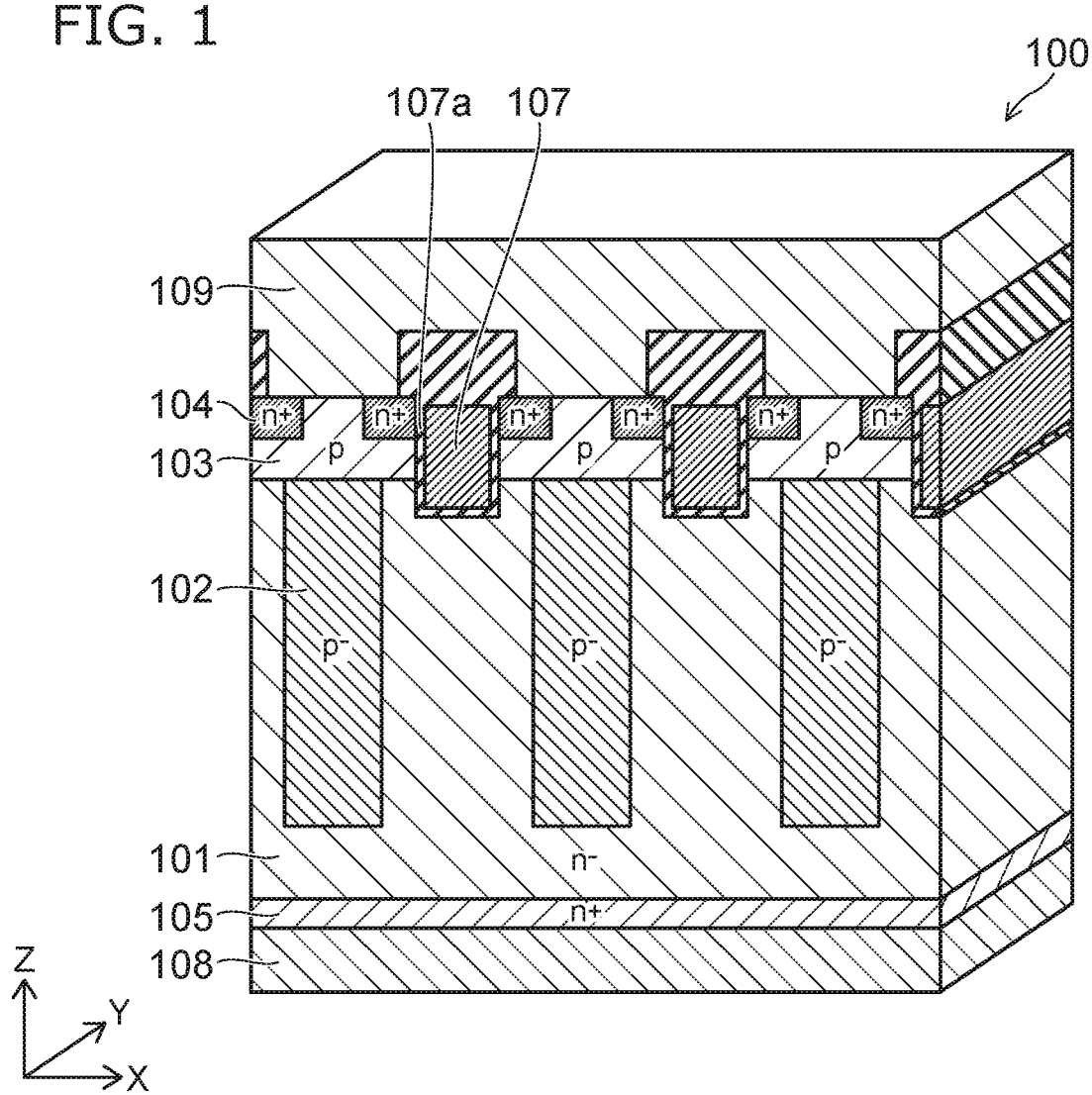
FIG. 1 is a perspective cross-sectional view showing a portion of a semiconductor device.

According to one embodiment, a method for manufacturing a semiconductor device is disclosed. The method can include forming a second layer covering a first layer on a first region of a semiconductor substrate. The semiconductor substrate includes the first region and a second region located around the first region. The first layer covers the second region and a portion of the first region. A plurality of first openings is formed to be separated from each other in another portion of the first region. The method can include removing the first layer on the second region using the second layer as a mask in order to expose an upper surface of the second region. The method can include forming an impurity region including an n-type impurity in the second region. The n-type impurity includes at least one selected from the group consisting of phosphorous, arsenic, and antimony. The method can include removing the second layer, and growing a plurality of silicon layers inside the first openings and on the second region. In addition, the method can include polishing a portion of each of the silicon layers using the first layer as a stopper.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

In the following descriptions and drawings, notations of $n^+$, $n^-$ and p, $p^-$ represent relative height of an impurity concentration in conductive types. That is, the notation with "+" shows a relatively higher impurity concentration than an impurity concentration for the notation without any of "+" and "−". The notation with "−" shows a relatively lower impurity concentration than the impurity concentration for the notation without any of them. These notations represent relative height of a net impurity concentration after mutual compensation of these impurities when respective regions include both of a p-type impurity and an n-type impurity.

FIG. 1 is a perspective cross-sectional view showing a portion of a semiconductor device.

A semiconductor device 100 shown in FIG. 1, for example, is manufactured using a method for manufacturing the semiconductor device according to the embodiment.

The semiconductor device 100 is a MOSFET. The semiconductor device 100 includes an $n^-$-type drift region 101, a $p^-$-type pillar region 102, a p-type base region 103, an $n^+$-type source region 104, an $n^+$-type drain region 105, a gate electrode 107, a drain electrode 108, and a source electrode 109.

An XYZ orthogonal coordinate system is used in the description of the embodiment. A direction from the $n^-$-type drift region 101 toward the p-type base region 103 is taken as a Z-direction. Two directions perpendicular to the Z-direction and orthogonal each other are taken as an X-direction and Y-direction. For description, a direction from the $n^-$-type drift region 101 toward the p-type base region 103 is referred to as "up", and the opposite direction is referred to as "down". These directions are based on a relative positional relationship between the $n^-$-type drift region 101 and the p-type base region 103, and are unrelated to a direction of gravity.

The drain electrode 108 is provided on a lower surface of the semiconductor device 100. The $n^+$-type drain region 105 is provided on the drain electrode 108 and is electrically connected to the drain electrode 108. The $n^-$-type drift region 101 is provided on the $n^+$-type drain region 105. The $p^-$-type pillar region 102 is provided in the $n^-$-type drift region 101. For example, the $p^-$-type pillar region 102 is provided in multiple in the X-direction. The multiple $p^-$-type pillar regions 102 and a portion of the $n^-$-type drift region 101 are arranged alternately in the X-direction.

The p-type base region 103 is provided on the $n^-$-type drift region 101 and the $p^-$-type pillar region 102. The $n^+$-type source region 104 is selectively provided on the p-type base region 103. The gate electrode 107 opposes to the portion of the $n^-$-type drift region 101, the p-type base region 103, and at least a portion of the $n^+$-type source region 104 in the X-direction via a gate insulating layer 107a.

The source electrode 109 is provided on the p-type base region 103 and the $n^+$-type source region 104, and is electrically connected to these semiconductor regions. The gate electrode 107 and the source electrode 109 are electrically isolated.

One example of materials of the respective constituent components of the semiconductor device 100 is described.

The n⁻-type drift region 101, the p⁻-type pillar region 102, the p-type base region 103, the n⁺-type source region 104, and the n⁺-type drain region 105 include silicon, for example, as a semiconductor material. Conductivity types of these semiconductor regions may be inverted. Arsenic, phosphor or antimony is used as the n-type impurity, and boron is used as the p-type impurity. The gate electrode 107 includes a conductive material such as polysilicon. The gate insulating layer 107a includes an insulating material such as silicon oxide. The drain electrode 108 and the source electrode 109 include a metal such as aluminum.

FIG. 2A to FIG. 5D are process cross-sectional views showing a manufacturing method according to the embodiment.

At first, an n-type semiconductor substrate 10 is prepared. The semiconductor substrate 10 includes an n⁺-type semiconductor region 15 and an n⁻-type first semiconductor region 11. The first semiconductor region 11 is provided on the semiconductor region 15. The semiconductor substrate 10 includes a first region R1 and a second region R2 located around the first region R1. A direction from the semiconductor region 15 toward the first semiconductor region 11 is perpendicular to a direction from the first region R1 toward the second region R2. For example, the first region R1 corresponds to a region where a valid chip is fabricated. The second region R2 corresponds to a region where an invalid chip is fabricated.

Figure 2A:
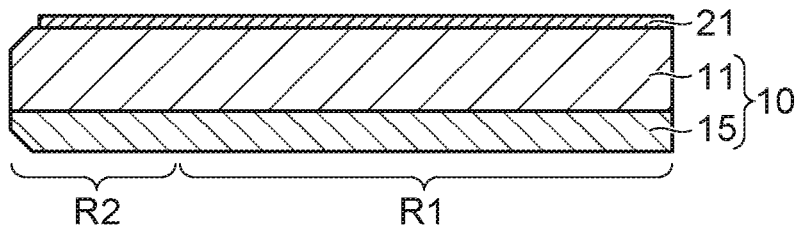
FIGS. 2A to 2E are process cross-sectional views showing a manufacturing method according to an embodiment.
Figure 2B:
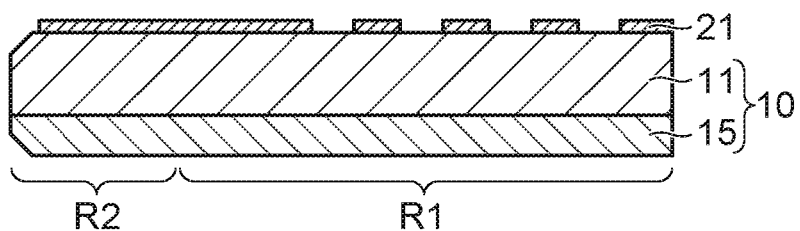
Figure 2C:
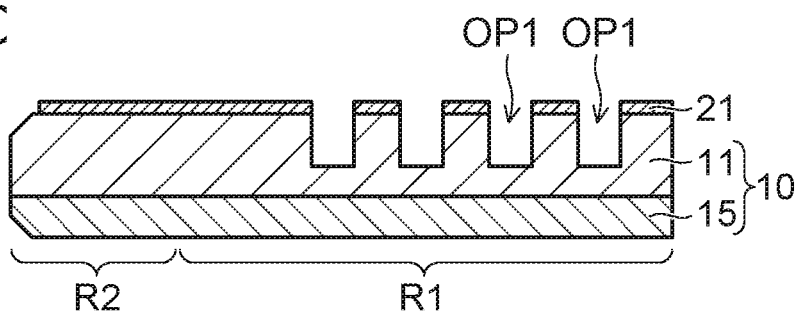

As shown in FIG. 2A, a first layer 21 is formed to cover the first region R1 and the second region R2 of the semiconductor substrate 10. The first layer 21 is, for example, a silicon oxide layer, and is formed using a CVD (Chemical Vapor Deposition) method. As shown in FIG. 2B, by using a photolithography method and RIE (Reactive Ion Etching) method, a portion of the first layer 21 is removed and the first layer 21 is patterned. Thereby, a portion of the first region R1 is exposed. By using the patterned first layer 21 as a mask, as shown in FIG. 2C, multiple first openings OP1 are formed in the exposed portion of the first region R1. The multiple openings OP1 are, for example, separated one another in the X-direction and extend in the Y-direction.

Figure 2D:
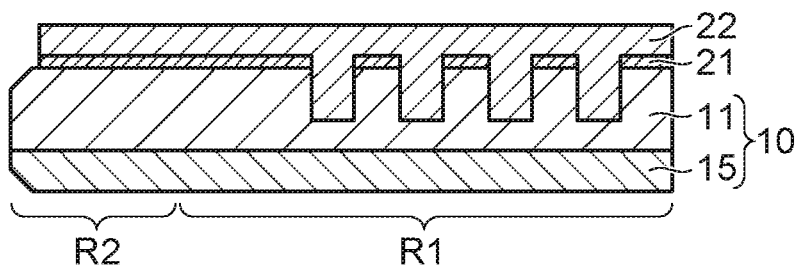

As shown in FIG. 2D, a second layer 22 is formed on the first region R1 and the second region R2 to cover the first layer 21. For example, the multiple first openings OP1 are filled with the second layer 22. The second layer 22 is, for example, a photoresist layer.

Figure 2E:
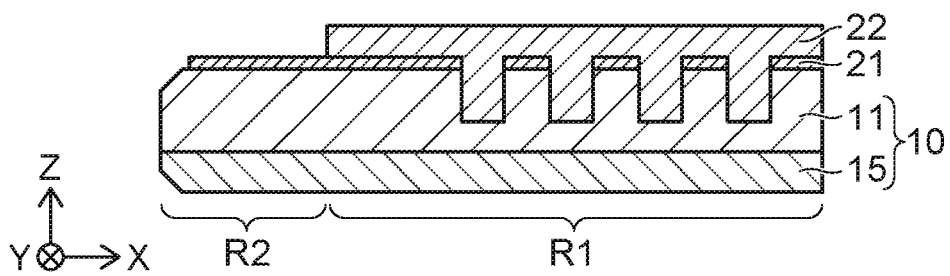
Figure 3A:
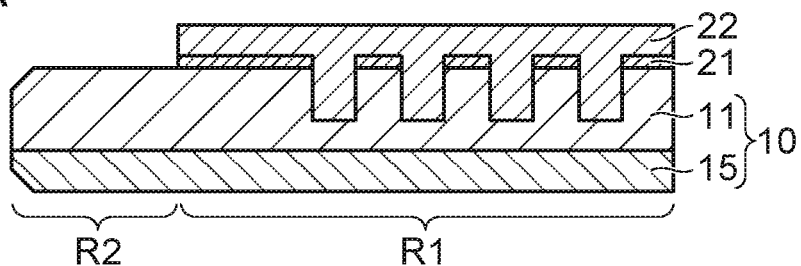
FIGS. 3A to 3E are process cross-sectional views showing a manufacturing method according to an embodiment.

As shown in FIG. 2E, the second layer 22 on the second region R2 is removed. As shown in FIG. 3A, the first layer 21 on the second region R2 is removed using the second layer 22 as a mask. Thereby, an upper surface of the second region R2 is exposed.

Figure 3B:
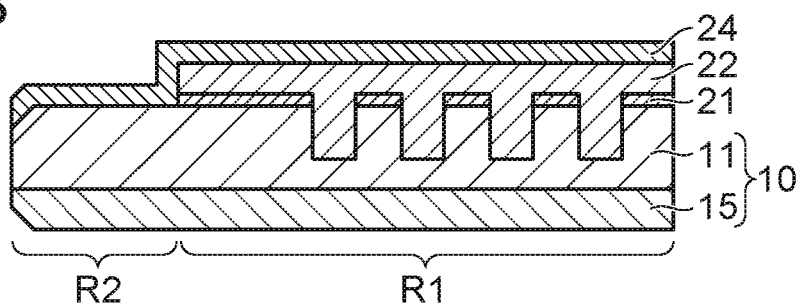
Figure 3C:
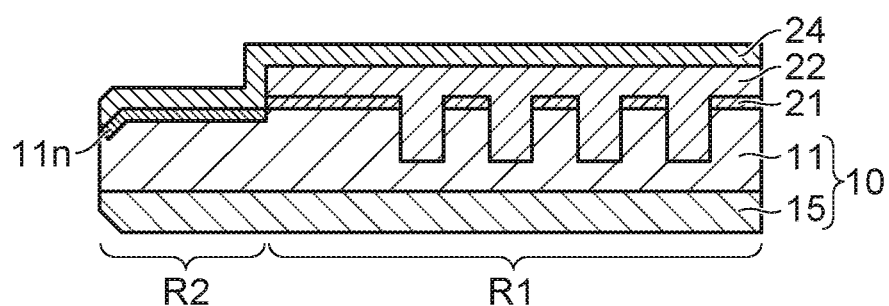

As shown in FIG. 3B, an impurity layer 24 is formed on the second region R2. The impurity layer 24 includes the n-type impurity. The n-type impurity is at least one selected from the group consisting of phosphor, arsenic, and antimony. The semiconductor substrate 10 is thermally treated. Thereby, as shown in FIG. 3C, the n-type impurity diffuses from the impurity layer 24 to the second region R2. An n-type impurity region 11n is formed at the upper surface of the second region R2.

Alternatively, another layer such as a polysilicon layer may be formed on the second region R2 and the impurity layer 24 may be formed on this other layer. The n-type impurity diffuses to the second region R2 via the other layer by thermally treating the semiconductor substrate 10, and the impurity region 11n is formed. Alternatively, using the first layer 21 and the second layer 22 as a mask, the n-type impurity is ion-implanted onto the upper surface of the second region R2. By doing this, the impurity region 11n may be formed. Alternatively, using the first layer 21 and the second layer 22 as a mask, vapor phase diffusion based on a gas including the n-type impurity is performed. By doing this, the impurity region 11n may be formed at the upper surface of the second region R2.

Figure 3D:
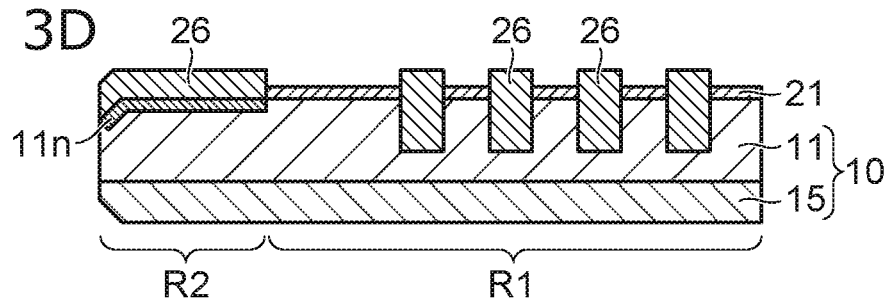
Figure 3E:
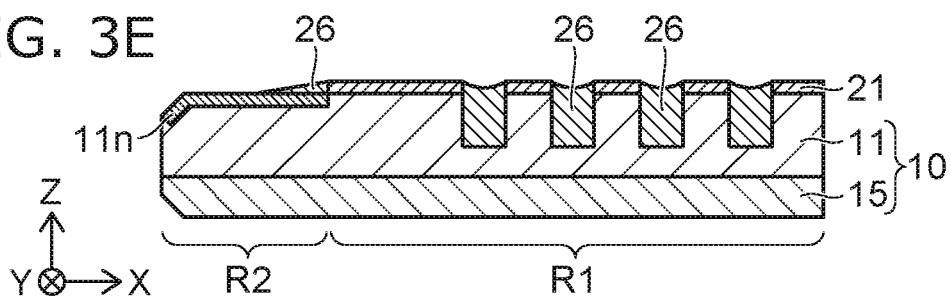

The impurity layer 24 and the second layer 22 are removed. As shown in FIG. 3D, multiple silicon layers 26 are formed inside the multiple first openings OP1 and on the impurity region 11n. The silicon layers 26 are formed, for example, by epitaxial growth. The silicon layers 26 include, for example, the p-type impurity. For example, heat applied to the semiconductor substrate 10 when forming the silicon layers 26 activates the n-type impurity in the impurity region 11n. As shown in FIG. 3E, the multiple silicon layers 26 are polished by CMP (Chemical Mechanical Polishing), At this time, the first layer 21 functions as a stopper to CMP.

Figure 4A:
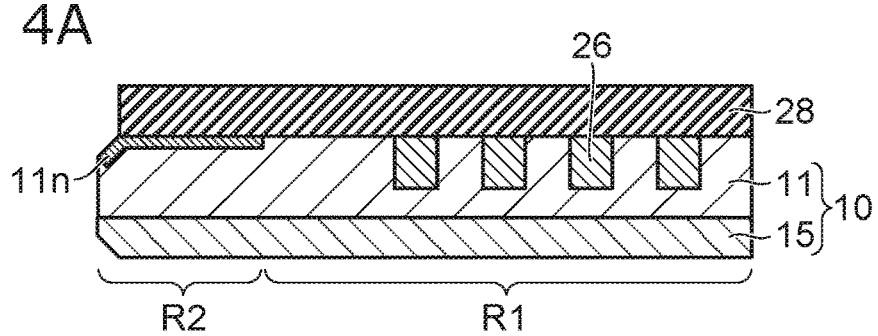
FIGS. 4A to 4E are process cross-sectional views showing a manufacturing method according to an embodiment.
Figure 4B:
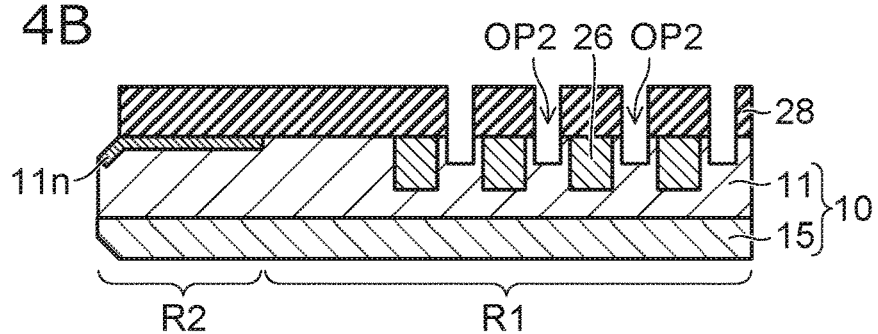

The first layer 21 is removed, and upper surfaces of the multiple silicon layers 26 are polished by CMP to be flattened. At this time, for example, the silicon layer 26 provided on the impurity region 11n is removed. As shown in FIG. 4A, a photoresist 28 covering the multiple silicon layers 26 is formed on the first region R1 and the second region R2. The photoresist 28 is patterned, and an upper surface of the first region R1 between the silicon layers 26 is exposed. By using the photoresist 28 as a mask, as shown in FIG. 4B, multiple second openings OP2 are formed on the upper surface of the first semiconductor region 11 in the first region R1. The respective second openings OP2 are located between the silicon layers 26, and extend in the Y-direction.

Figure 4C:
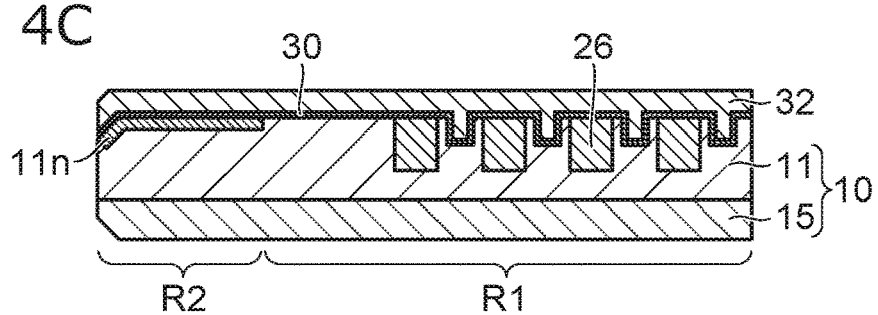

The photoresist 28 is removed. An oxide layer 30 is formed along an upper surface of the semiconductor substrate 10 by thermally oxidizing the semiconductor substrate 10. As shown in FIG. 4C, a conductive layer 32 is formed on the oxide layer 30. The multiple second openings OP2 are filled with the conductive layer 32.

Figure 4D:
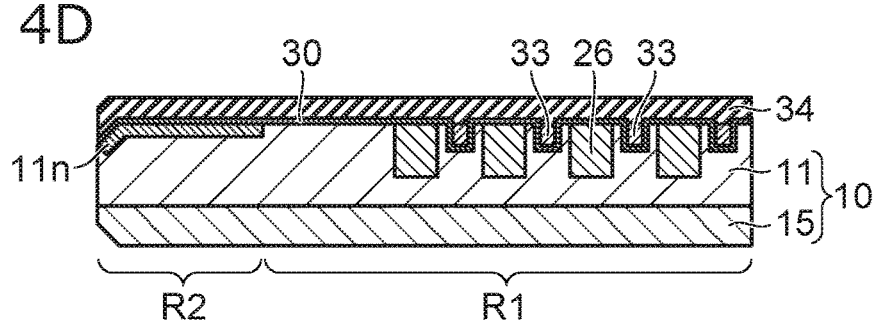

An upper surface of the conductive layer 32 recedes by wet etching or CDE (Chemical Dry Etching), and multiple conductive layers 33 are formed. The multiple conductive layers 33 are provided inside the multiple second openings OP2, respectively and separated one another. The conductive layers 33 correspond to the gate electrode 107. The oxide layer 30 between the semiconductor substrate 10 and the conductive layers 33 correspond to a gate insulating layer 107a. As shown in FIG. 4D, a photoresist 34 covering the multiple conductive layers 33 is formed on the first region R1 and the second region R2.

Figure 4E:
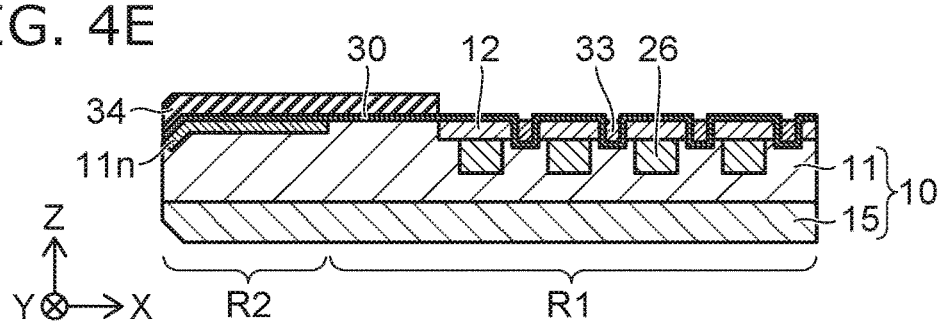

A portion of the photoresist 34 is removed, the portion being located on the multiple silicon layers 26 and the multiple conductive layers 33. As shown in FIG. 4E, using the photoresist 34 as a mask, the p-type impurity is ion-implanted onto the upper surface of the first region R1. Thereby, p-type multiple second semiconductor regions 12 are formed.

Figure 5A:
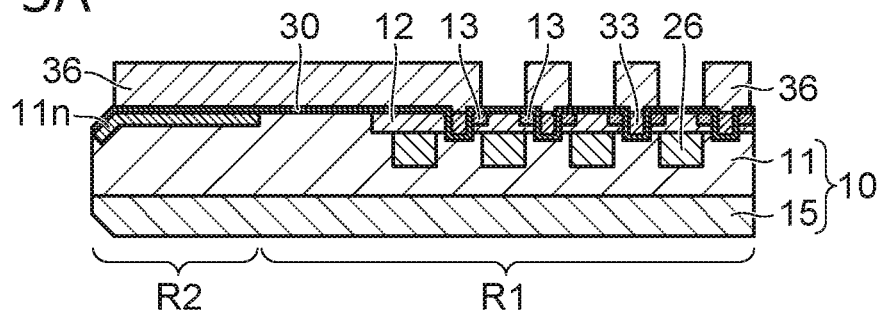
FIGS. 5A to 5D are process cross-sectional views showing a manufacturing method according to an embodiment.

The photoresist 34 is removed, and a photoresist 36 covering the multiple conductive layers 33 is formed on the first region R1 and the second region R2. A portion of the photoresist 36 located on the multiple silicon layers 26 is removed. By using the photoresist 36 as a mask, the n-type impurity is ion-implanted onto upper surfaces of the second semiconductor regions 12 in an inclined direction. Thereby, as shown in FIG. 5A, n-type multiple third semiconductor regions 13 are formed. The second semiconductor regions 12 and the third semiconductor regions 13 correspond to the p-type base region 103 and the n⁺-type source region 104, respectively. The silicon layers 26 below the second semiconductor regions 12 correspond to the p⁻-type pillar regions 102.

Figure 5B:
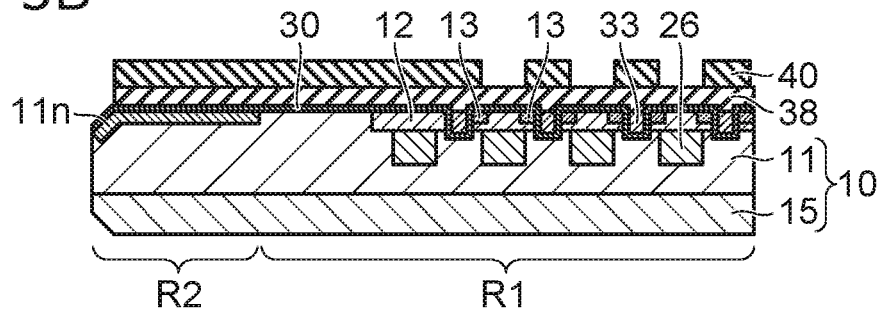

The photoresist 36 is removed. An oxide layer 38 covering the multiple second semiconductor regions 12 and the multiple conductive layers 33 is formed. A photoresist 40 is formed on the oxide layer 38. As shown in FIG. 5B, a portion of the photoresist 40 located on the silicon layers 26 is removed, and the photoresist 40 is patterned.

Figure 5C:
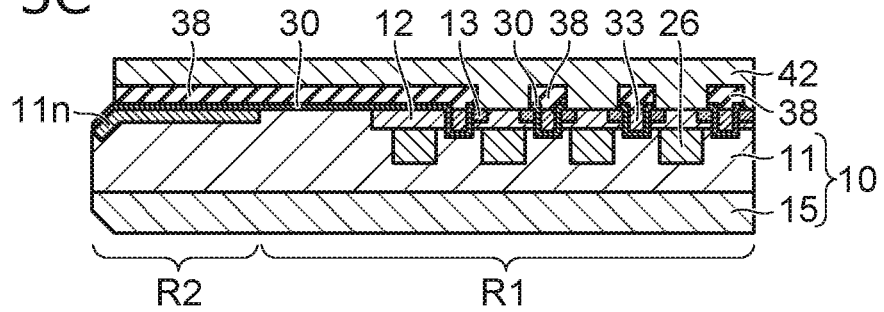

A portion of the oxide layer 38 is removed, by RIE, using the patterned photoresist 40 as a mask. Thereby, the upper surfaces of the second semiconductor regions and the upper surfaces of the third semiconductor regions are exposed. The photoresist 40 is removed, and as shown in FIG. 5C, a metal layer 42 covering the multiple oxide layers 38 is formed. The source electrode 109 is formed by patterning the metal layer 42.

Figure 5D:
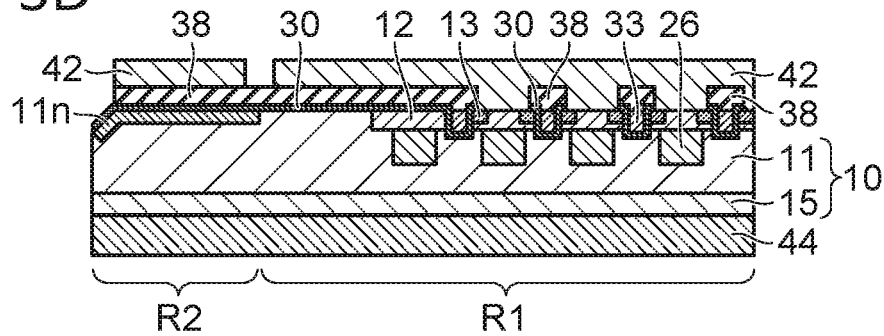

As shown in FIG. 5D, a lower surface of the semiconductor substrate 10 is polished until the semiconductor region 15 has a predetermined thickness. A metal layer 44 is formed on the lower surface of the semiconductor substrate 10. This metal layer 44 corresponds to the drain electrode 108. After that, the semiconductor device 100 shown in FIG. 1 is obtained by dividing the semiconductor substrate 10 into multiple chips.

The effect of the manufacturing method according to the embodiment will be described.

In a manufacturing process of a semiconductor device, as shown in FIG. 2C, the silicon layers 26 may be grown inside the respective first openings OP1 as shown in FIG. 3D, after forming the multiple first openings OP1 as shown in FIG. 2C. The inventor found that when the first layer 21 (mask) is provided long and continuously, the followings occur. When the silicon layers 26 are grown, particularly in the second region R2 of the semiconductor substrate 10, silicon is also deposited on the first layer 21. When silicon is deposited on the first layer 21, garbage is caused to occur in polishing the silicon layers 26 in the later process. Therefore, deposition amount of silicon on the first layer 21 is favorable to be small.

In order to suppress the deposition of silicon on the first layer 21, it is effective to grow the silicon layer in the first opening OP1 after removing the first layer 21 on the second region R2. A length of the first layer 21 in a direction from the first openings OP1 toward a circumference of the semiconductor substrate 10 can be short by removing the first layer 21 on the second region R2. Thereby, silicon can be suppressed from depositing on the first layer 21.

When the first layer 21 on the second region R2 is removed, the upper surface of the second region R2 is exposed. Therefore, as shown in FIG. 3D, the silicon layer 26 is formed also on the second region R2. In this case, when polishing the silicon layers 26 by CMP in the later process, the second region R2 has no first layer 21 functioning as a stopper. Because of this, if the second region R2 is polished after the silicon layers 26 are polished to be exhausted, the upper surface of the second region R2 is excessively polished, and a position of the upper surface of the second region R2 is lower than a position of the upper surface of the first region R1.

In a photolithography process, for example, the semiconductor substrate 10 is irradiated with light in an inclined direction before exposing the photoresist. A focal length is sensed by measuring the reflected light. If the second region R2 and the first region R1 have different height as described above, defocusing occurs and the focal length cannot be sensed accurately. As a result, in the later exposure of the photoresist, the light is not adequately focused on the upper surface of the semiconductor substrate 10, and the photoresist cannot be patterned normally.

The inventor has found the followings about this problem. The impurity region 11n including the n-type impurity is formed in advance on the upper surface of the second region R2. Thereby, when polishing the silicon layers 26, a polishing rate in the second region R2 can be reduced.

According to this method, the configuration change in the second region R2 can be suppressed. In the later photolithography process, the light can be adequately focused to the semiconductor substrate 10. As a result, the yield of the method for manufacturing the semiconductor device can be improved.

If the impurity region 11n is formed, also when flattening the upper surfaces of the silicon layers 26 after the process shown in FIG. 3E, the upper surface of the second region R2 can be suppressed from being excessively polished.

TABLE 1

| C [atoms/cm³] | R [μm/min] |
|---|---|
| 6.0 × 10²⁰ | 1.4 |
| 1.2 × 10²¹ | 0.18 |

Table 1 shows a peak concentration C [atoms/cm³] of phosphorous in the impurity region 11n and a polishing rate R [μm/min] in the concentration C.

From Table 1, if the peak concentration C of phosphorous becomes 1×10²¹ [atoms/cm³] level, the polishing rate is decreased greatly in comparison with the case of the peak concentration of phosphorous being 6×10²⁰ [atoms/cm³]. Therefore, the peak concentration of phosphorous in the impurity region 11n is favorable to be not less than 1×10²¹ [atoms/cm³].

The impurity region 11n may include other impurities other than phosphorous. For example, if the peak concentration of phosphorous in the impurity region 11n is within the above range, the impurity region 11n may further include other n-type impurity or p-type impurity. Phosphorous included in the impurity region 11n may be either activated or inactive.

(Variation)

FIGS. 6A to 6D are process cross-sectional views showing a manufacturing method according to a variation of an embodiment.

In examples of the manufacturing method shown in FIG. 2A to FIG. 5D, the impurity region 11n is formed at the upper surface of the second region R2. That is, the peak concentration of the n-type impurity in the impurity region 11n exists at the upper surface of the second region R2 (the upper surface of the impurity region 11n). Not to limited to this example, the impurity region 11n may be formed at a position apart from the upper surface of the second region R2. In other words, the impurity region 11n may be formed so that the peak concentration of the n-type impurity in the impurity region 11n is located at a position apart from the upper surface of the second region R2.

Figure 6A:
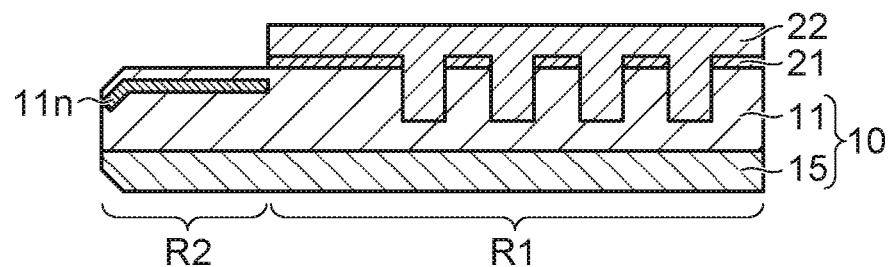
FIGS. 6A to 6D are process cross-sectional views showing a manufacturing method according to a variation of an embodiment.

Processes similar to the processes shown in FIG. 2A to FIG. 3A are performed, and the upper surface of the second region R2 is exposed. After that, the n-type impurity is ion-implanted to the second region R2 by using the first layer and the second layer as a mask, and the impurity region 11n is formed. At this time, as shown in FIG. 6A, ion implantation is performed so that the impurity region 11n is formed at the position apart from the upper surface of the second region R2.

Figure 6B:
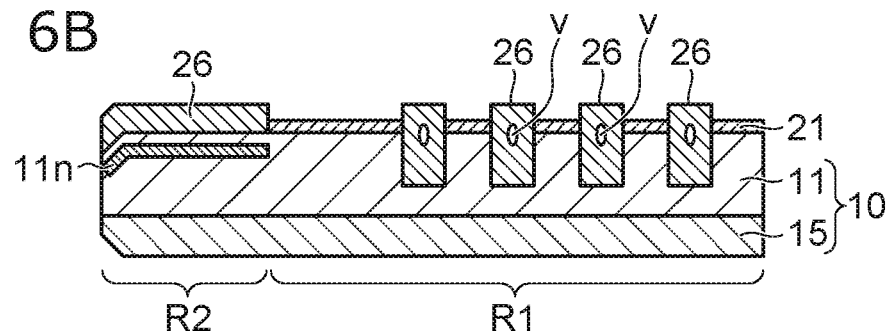

The second layer 22 is removed. As shown in FIG. 6B, multiple silicon layers 26 containing a p-type impurity are formed by, for example, an epitaxial growth inside the multiple openings OP1 and on the impurity region 11n. At this time, for example, a void V is formed in the silicon layers 26 provided in the first openings OP1.

Figure 6C:
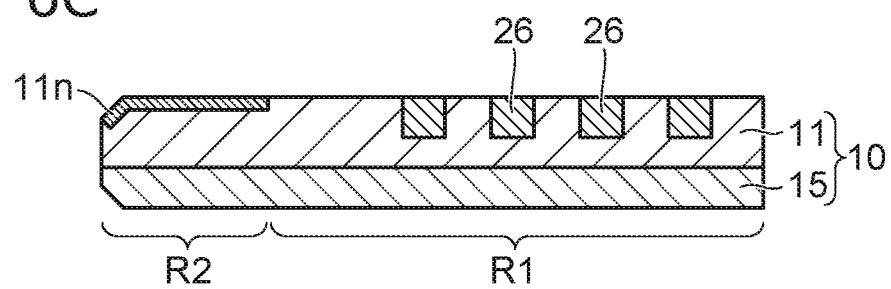

The first layer 21 is removed. As shown in FIG. 6C, the upper surfaces of the multiple silicon layers 26 are polished to be flat. At this time, a portion of the silicon layers 26 provided on the impurity region 11n and a portion of the semiconductor region 11 are removed. In the case where the void is included in the silicon layers 26, the upper surfaces of the silicon layers 26 are polished to be flat and to expose the void.

Figure 6D:
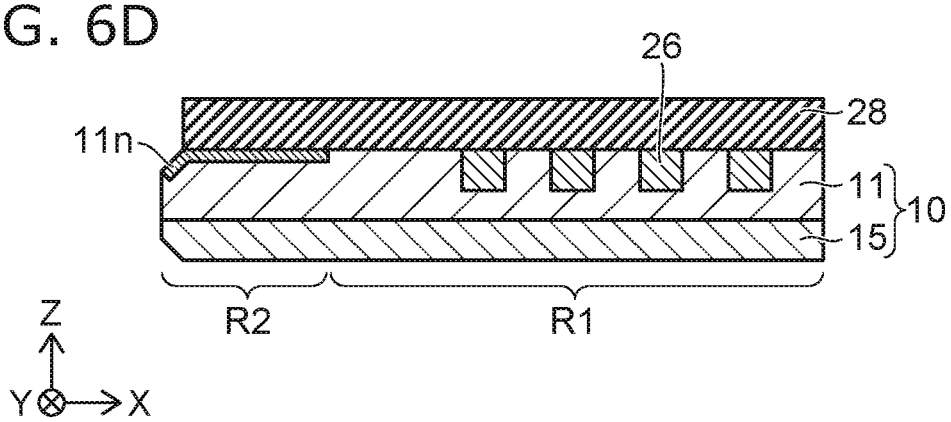

As shown in FIG. 6D, a photoresist 28 covering the multiple silicon layers 26 is formed on the first region R1 and the second region R2. After that, processes similar to the processes shown in FIG. 4B to FIG. 5E are performed, and thus the semiconductor device 100 is obtained.

When the silicon layers 26 are formed in the first openings OP1, the void V may be formed in the silicon layers 26 as shown in FIG. 6B. In this case, in order to make the upper surfaces of the silicon layers 26 flatter, it is desired in the polishing of the silicon layers 26 to remove the portions of the silicon layers 26 where the void V is formed.

In order to remove the portions of the silicon layers 26 where the void V is formed, the upper surfaces of the silicon layers 26 must be receded to a deeper position. At this time, if the impurity region 11n is provided at the upper surface of the second region R2, a position in the Z-direction of the upper surfaces of the silicon layers 26 is lower than a position in the Z-direction of the upper surface of the second region R2 after the polishing by CMP. If the position of the upper surfaces of the silicon layers 26 is different from the position of the upper surface of the impurity region 11n, there is a possibility that a focal length cannot be sensed accurately in the lithography process.

With respect to this point, in the manufacturing method according to the variation, the impurity region 11n is formed at the position apart from the upper surface of the second region R2. That is, the impurity region 11n is formed so that the peak concentration of the n-type impurity in the impurity region 11n is located at a position apart from the upper surface of the second region R2, the position being at the same depth as at least a portion of the first openings OP1. For example, the impurity region 11n is formed at the same depth as the expected position of the upper surfaces of the silicon layers 26 after the polishing.

According to this method, the upper surface of the second region R2 is also receded to the position where the impurity region 11n is provided depending on the receding of the upper surfaces of the silicon layers 26 in the polishing. Therefore, a difference between the position in the Z-direction of the upper surfaces of the silicon layers 26 after the polishing and the position in the Z-direction of the upper surface of the impurity region 11n can be small. Thereby, in the later lithography process, the light is adequately focused to the semiconductor substrate 10, and the yield of the method for manufacturing the semiconductor device can be further improved.

In the embodiment described above, impurity concentrations in the respective semiconductor regions are possible to be measured, for example, by SIMS (Secondary Ion Mass Spectroscopy). Carrier concentrations in the respective semiconductor regions can be regarded to be equal to the activated impurity concentration in the respective semiconductor regions. Therefore, impurity concentrations in the respective semiconductor regions are also possible to be confirmed using SCM (Scanning Electrostatic Capacitance Microscopy).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:
    forming a second layer covering a first layer on a first region of a semiconductor substrate, the semiconductor substrate including the first region and a second region located around the first region, the first layer covering the second region and a portion of the first region, a plurality of first openings being formed to be separated from each other in another portion of the first region;
    removing the first layer on the second region using the second layer as a mask in order to expose an upper surface of the second region;
    forming an impurity region including an n-type impurity in the second region, the n-type impurity including at least one selected from the group consisting of phosphorous, arsenic, and antimony;
    removing the second layer;
    growing a plurality of silicon layers respectively inside the first openings and on the second region; and
    polishing a portion of each of the silicon layers using the first layer as a stopper.

2. The method according to claim 1, wherein
the impurity region is formed at the upper surface of the second region.

3. The method according to claim 2, wherein
the forming the impurity region includes
    forming an impurity layer including the n-type impurity at the upper surface of the second region, and
    thermally treating the semiconductor substrate to diffuse the n-type impurity from the impurity layer to the upper surface of the second region.

4. The method according to claim 1, wherein
the impurity region is formed so that a peak concentration of the n-type impurity in the impurity region is located at a position apart from the upper surface of the second region, the position being at the same depth as at least a portion of each of the first openings.

5. The method according to claim 1, further comprising:
    forming a plurality of second openings after the polishing, the first region including a first semiconductor region of a first conductivity type, the first openings and the silicon layers being formed in the first semiconductor region, the second openings being formed in the first region, the second openings being located respectively between the silicon layers;
    forming a plurality of gate electrodes respectively in the second openings via gate insulating layers;
    forming second semiconductor regions on an upper surface of the first semiconductor region and on upper surfaces of the silicon layers, the second semiconductor regions located respectively between the gate electrodes, the second semiconductor region being of a second conductivity type; and forming a third semiconductor region on an upper surface of the second semiconductor region, the third semiconductor region being of the first conductivity type, the semiconductor substrate including the first semiconductor region of the first conductivity type.

6. The method according to claim 5, further comprising:
forming a first metal layer on the third semiconductor region; and
forming a second metal layer below the first semiconductor region.

7. The method according to claim 6, wherein
the first metal layer is electrically connected to the second semiconductor region and the third semiconductor region, and electrically isolated from the gate electrodes, and
the second metal layer is electrically connected to the first semiconductor region.

8. The method according to claim 1, wherein
the impurity region includes phosphorous, and
a peak concentration of phosphorous in the impurity region is not less than $1.0 \times 10^{21}$ atoms/cm$^3$.

9. The method according to claim 1, wherein phosphorous included in the impurity region is activated.

10. The method according to claim 1, wherein
the silicon layers include a p-type impurity, and
the silicon layers are formed by an epitaxial growth.

11. The method according to claim 1, wherein a polishing rate of the impurity region is slower than a polishing rate of the silicon layers in the polishing.

12. The method according to claim 1, wherein
the first layer includes silicon oxide, and
the second layer includes a photoresist.

* * * * *